US010996190B2

(12) United States Patent
Beck et al.

(10) Patent No.: US 10,996,190 B2
(45) Date of Patent: May 4, 2021

(54) ELECTROCHEMICAL GAS SENSOR CONSTRUCTED WITH MEMS FABRICATION TECHNOLOGY

(71) Applicant: HONEYWELL INTERNATIONAL INC., Morris Plains, NJ (US)

(72) Inventors: Scott Edward Beck, Morris Plains, NJ (US); Yong-Fa Wang, Morris Plains, NJ (US); Robert Higashi, Morris Plains, NJ (US); Philip Clayton Foster, Morris Plains, NJ (US); Keith Francis Edwin Pratt, Morris Plains, NJ (US); Cristian Vasile Diaconu, Morris Plains, NJ (US)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 246 days.

(21) Appl. No.: 16/178,935

(22) Filed: Nov. 2, 2018

(65) Prior Publication Data

US 2019/0137440 A1 May 9, 2019

(30) Foreign Application Priority Data

Nov. 3, 2017 (EP) ..................................... 17199871

(51) Int. Cl.
*G01N 27/407* (2006.01)
*G01N 27/404* (2006.01)
(Continued)

(52) U.S. Cl.
CPC ....... *G01N 27/4071* (2013.01); *B81B 7/0061* (2013.01); *B81C 1/00269* (2013.01);
(Continued)

(58) Field of Classification Search
CPC ............ G01N 27/4071; B81C 1/00269; B81C 2203/0118
See application file for complete search history.

(56) References Cited

U.S. PATENT DOCUMENTS

| 4,668,374 A | * | 5/1987 | Bhagat ............... G01N 27/4071 204/412 |
| 5,387,329 A | * | 2/1995 | Foos ..................... C08F 220/14 204/403.06 |

(Continued)

FOREIGN PATENT DOCUMENTS

| EP | 3480589 A1 | 5/2019 |
| WO | 2001/014864 A2 | 3/2001 |
| WO | 2017/118490 A1 | 7/2017 |

OTHER PUBLICATIONS

Extended European Search Report for Application No. 17199871.9, dated May 25, 2018, 8 pages.

*Primary Examiner* — Luan V Van
*Assistant Examiner* — Caitlyn Mingyun Sun
(74) *Attorney, Agent, or Firm* — Alston & Bird LLP (57) ABSTRACT

Apparatus and associated methods relate to a micro-electromechanical system (MEMS) based gas sensor including an electrolyte contacting one or more top electrode(s) arranged on the bottom surface of a top semiconductor substrate (TSS), and one or more bottom electrode(s) arranged on the top of a bottom semiconductor substrate (BSS), the TSS and BSS joined with an adhesive seal around the electrolyte, the sensor including one or more capillaries providing gaseous communication to the electrolyte from an external ambient environment. The electrodes may be electrically accessed by one or more vias to externally accessible bond pads. In some examples, an electrical connection may be made from an additional bond pad on top of the TSS to the electrolyte. Various embodiments may reduce the size of various gas (Continued)

sensors to advantageously allow their inclusion into portable electronic devices.

16 Claims, 10 Drawing Sheets

(51) Int. Cl.
    *B81B 7/00*          (2006.01)
    *B81C 1/00*          (2006.01)

(52) U.S. Cl.
CPC .. *G01N 27/4045* (2013.01); *B81B 2201/0214* (2013.01); *B81B 2203/0315* (2013.01); *B81B 2203/04* (2013.01); *B81C 2201/0132* (2013.01); *B81C 2201/0133* (2013.01); *B81C 2201/0176* (2013.01); *B81C 2203/0118* (2013.01); *B81C 2203/032* (2013.01); *G01N 27/404* (2013.01)

(56) References Cited

U.S. PATENT DOCUMENTS

| | | |
|---|---|---|
| 7,022,213 B1 | 4/2006 | Austen et al. |
| 9,011,776 B2 * | 4/2015 | Ziglioli .................. H04R 1/086 |
| | | 422/68.1 |
| 2004/0026246 A1 | 2/2004 | Chapples et al. |
| 2005/0145493 A1 | 7/2005 | Saffell et al. |
| 2017/0102355 A1 * | 4/2017 | McGuinness ........ G01N 27/413 |
| 2018/0059044 A1 * | 3/2018 | Berduque .......... G01N 27/4045 |

* cited by examiner

ELECTROCHEMICAL GAS SENSOR CONSTRUCTED WITH MEMS FABRICATION TECHNOLOGY

CROSS-REFERENCE TO RELATED APPLICATIONS

This application claims the benefit of European Patent Application No. 17199871.9 filed Nov. 3, 2017, the disclosure of which is herein incorporated by reference in its entirety.

TECHNICAL FIELD

Various embodiments relate generally to gas sensing.

BACKGROUND

Electrochemical gas sensors are gas detectors that measure the concentration of a target gas by oxidizing or reducing the target gas at an electrode and measuring the resulting current. These types of sensors may contain one or more electrodes in contact with an electrolyte. Gas may diffuse into the sensor through a porous membrane to a working electrode where it is oxidized or reduced. This electrochemical reaction may result in an electric current that may pass through an external circuit for intensity measurement, for example.

Gas sensors may be employed for personal safety in settings where dangerous gases may suddenly exist. The sensors may trigger audible alarms and/or visible warning lights.

SUMMARY

Apparatus and associated methods relate to a microelectro-mechanical system (MEMS) based gas sensor including an electrolyte contacting one or more top electrode(s) arranged on the bottom surface of a top semiconductor substrate (TSS), and one or more bottom electrode(s) arranged on the top of a bottom semiconductor substrate (BSS), the TSS and BSS joined with an adhesive seal around the electrolyte, the sensor including one or more capillaries providing gaseous communication to the electrolyte from an external ambient environment. The electrodes may be electrically accessed by one or more vias to externally accessible bond pads. In some examples, an electrical connection may be made from an additional bond pad on top of the TSS to the electrolyte. Various embodiments may reduce the size of various gas sensors to advantageously allow their inclusion into portable electronic devices.

Various embodiments may achieve one or more advantages. For example, various embodiments may be produced more economically and those savings may be passed on to end-customers. The lower impedances due to the smaller sensor size may yield improved accuracy. In various examples, the enclosed electrolyte may substantially minimize evaporation, which may advantageously increase sensor lifespan. For a given device size, some users may experience an increase in functionality as the number of various gases detected may increase.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Figure 2:
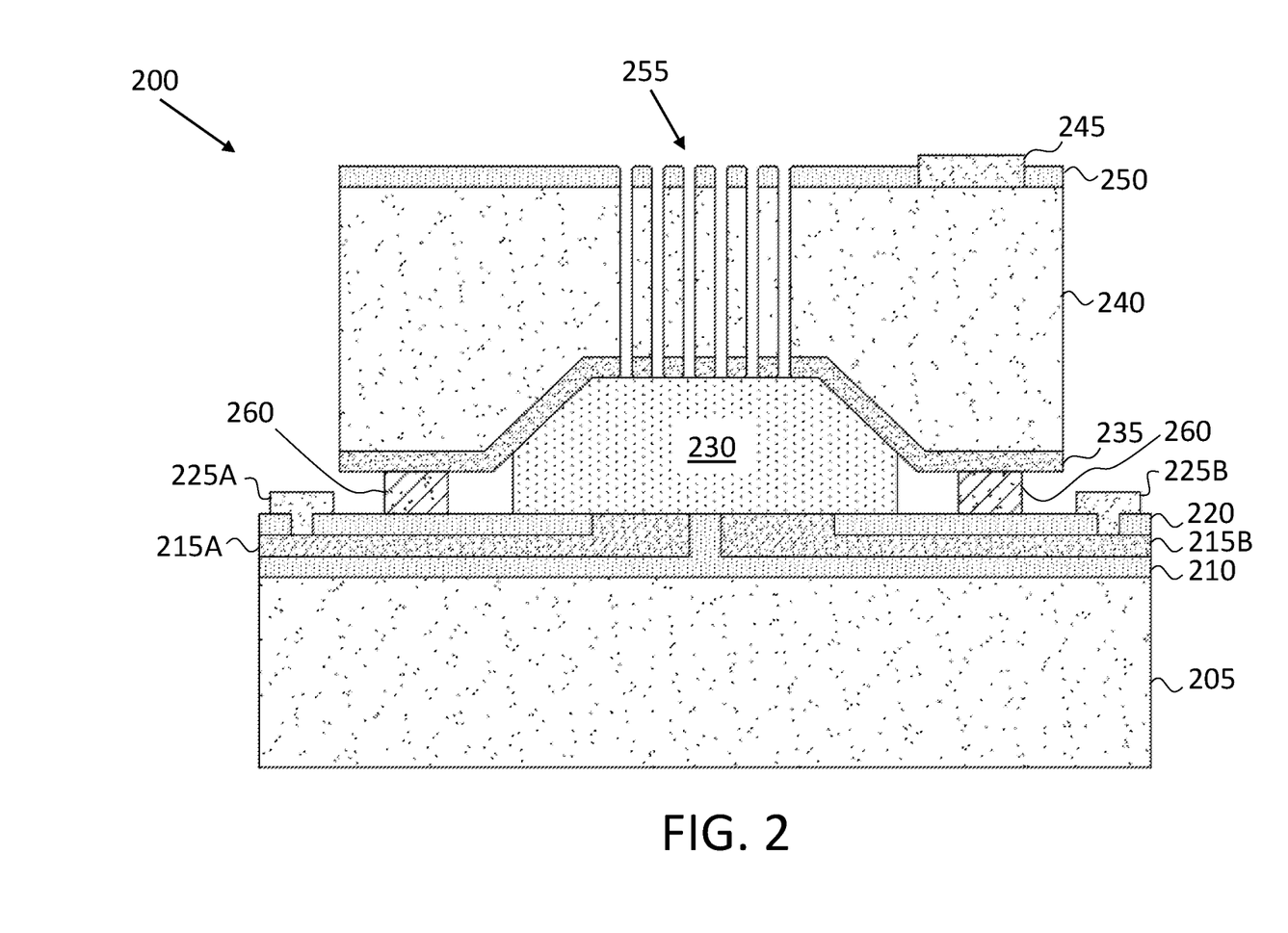
FIG. 2 depicts a cross-sectional elevation view of an exemplary two-electrode MEMS-based gas sensor implemented on a silicon wafer stack with bond pads on two levels.
Figure 3:
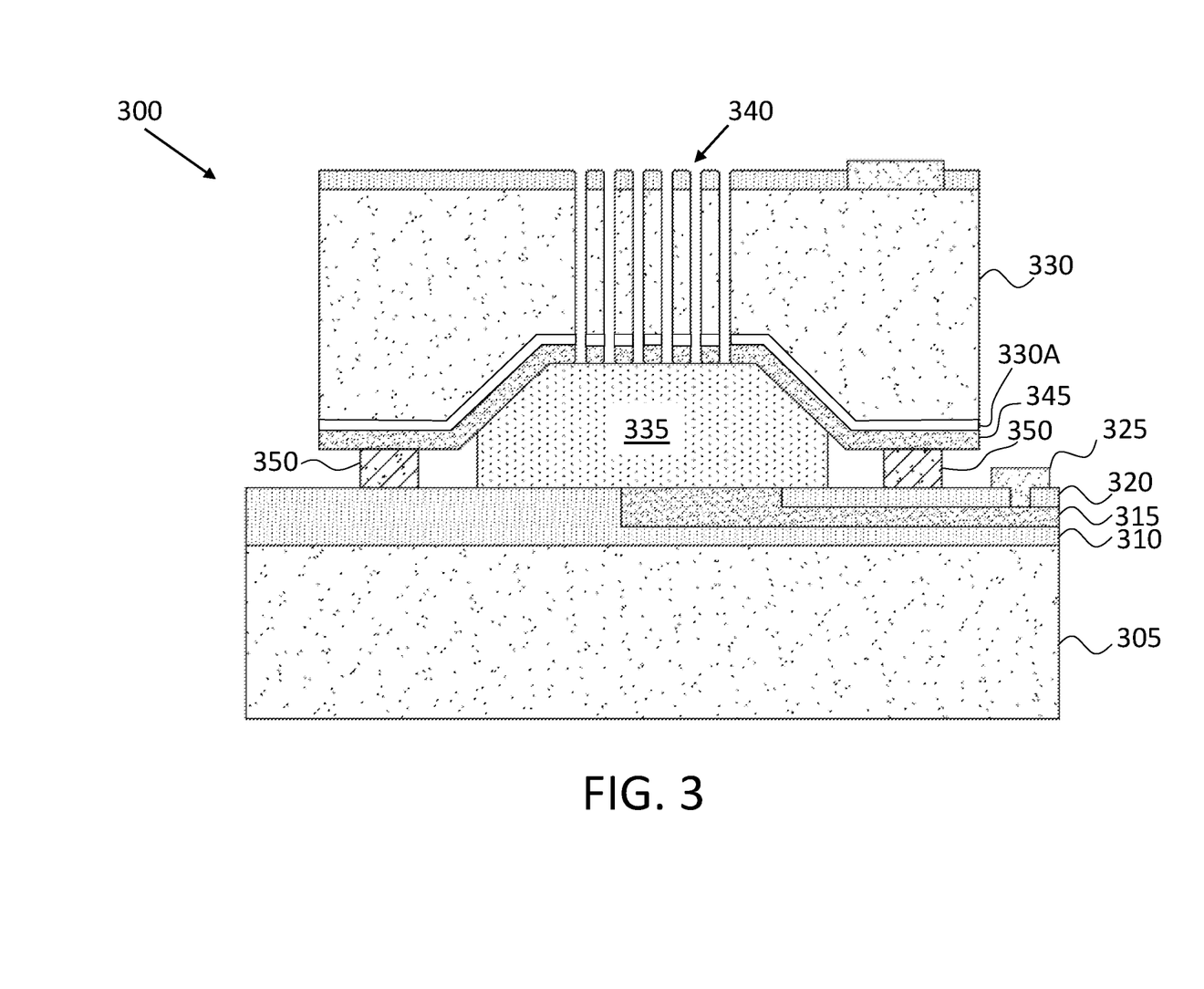
FIG. 3 depicts a cross-sectional elevation view of an exemplary single-electrode MEMS-based gas sensor implemented on a silicon wafer stack.
Figure 4:
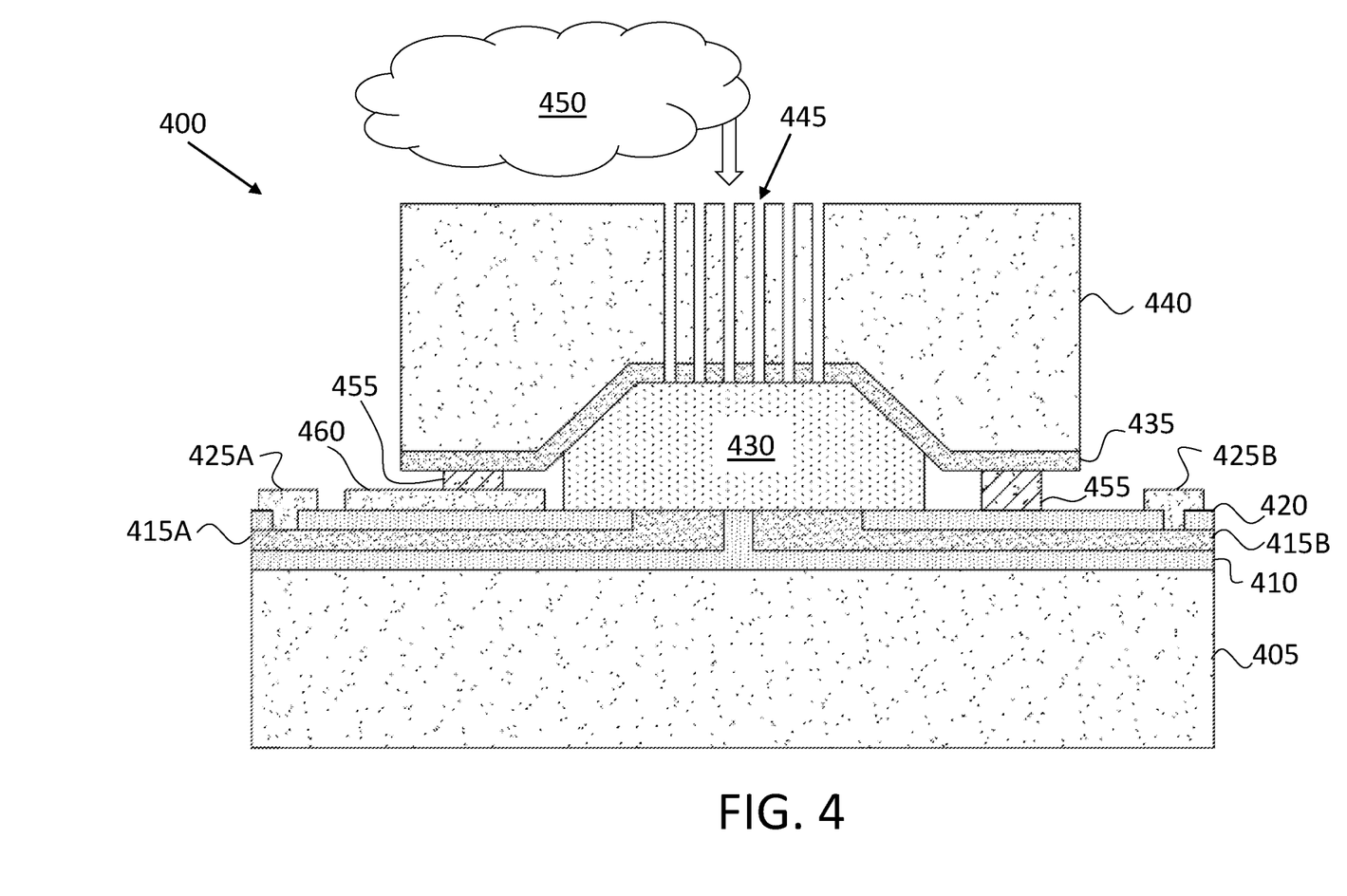
FIG. 4 depicts a cross-sectional elevation view of an exemplary MEMS-based gas sensor implemented on a silicon wafer stack with bond pads on a single level.
Figure 5:
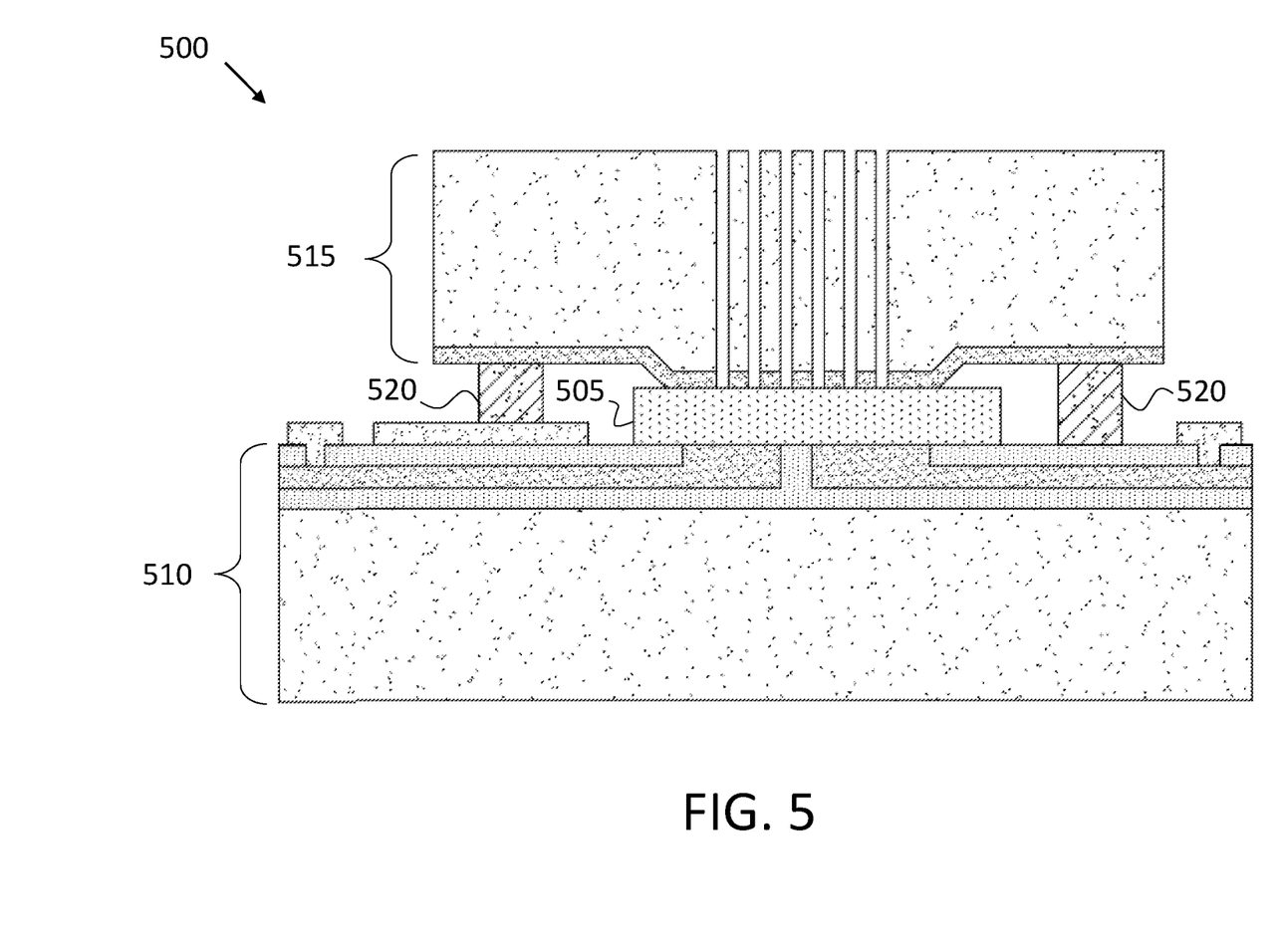
FIG. 5 depicts a cross-sectional elevation view of an exemplary MEMS-based gas sensor implemented on a silicon wafer stack with a convex top wafer and with bond pads on a single level.
Figure 6:
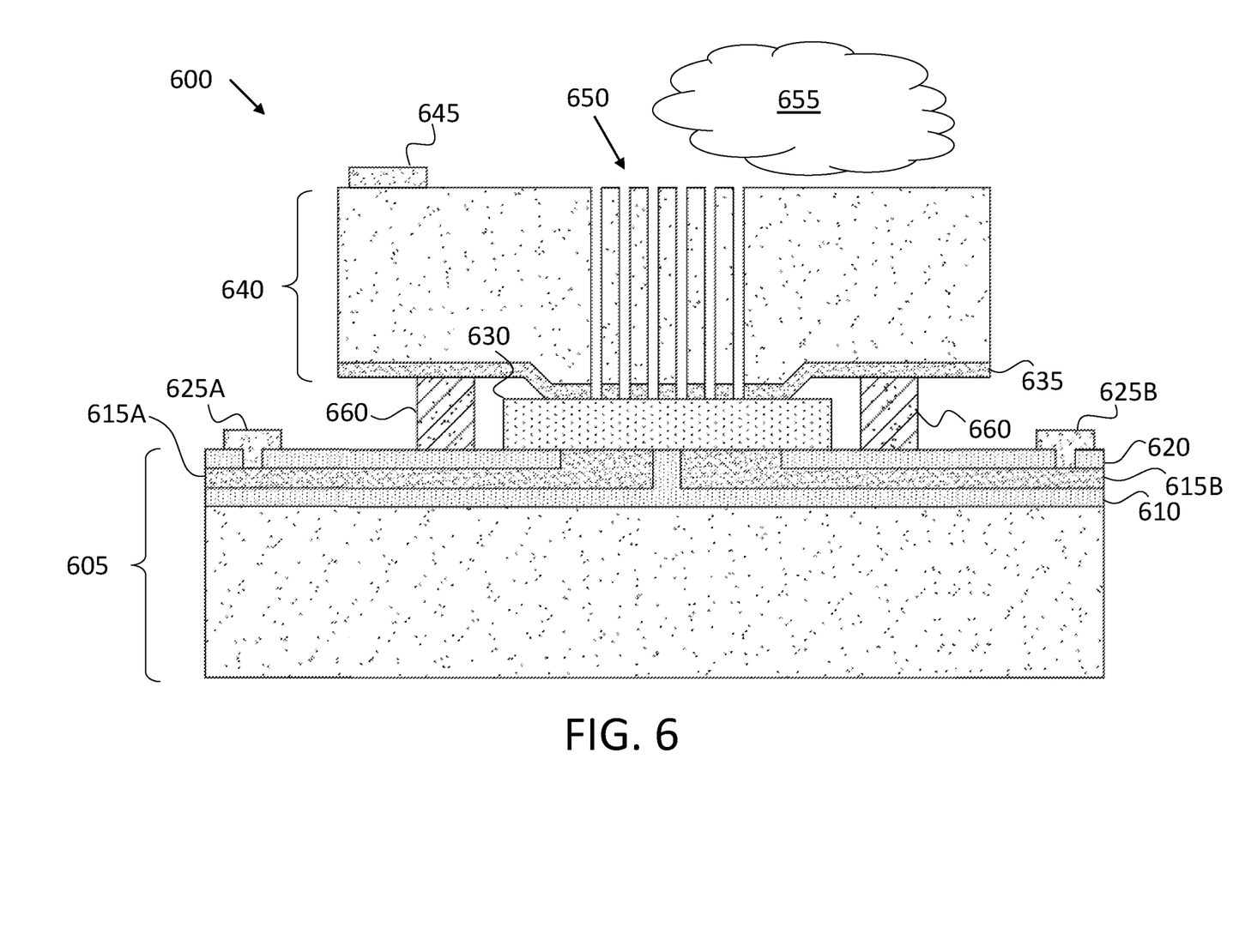
FIG. 6 depicts a cross-sectional elevation view of an exemplary MEMS-based gas sensor implemented on a silicon wafer stack with a convex top wafer and with bond pads on two levels.
Figure 7:
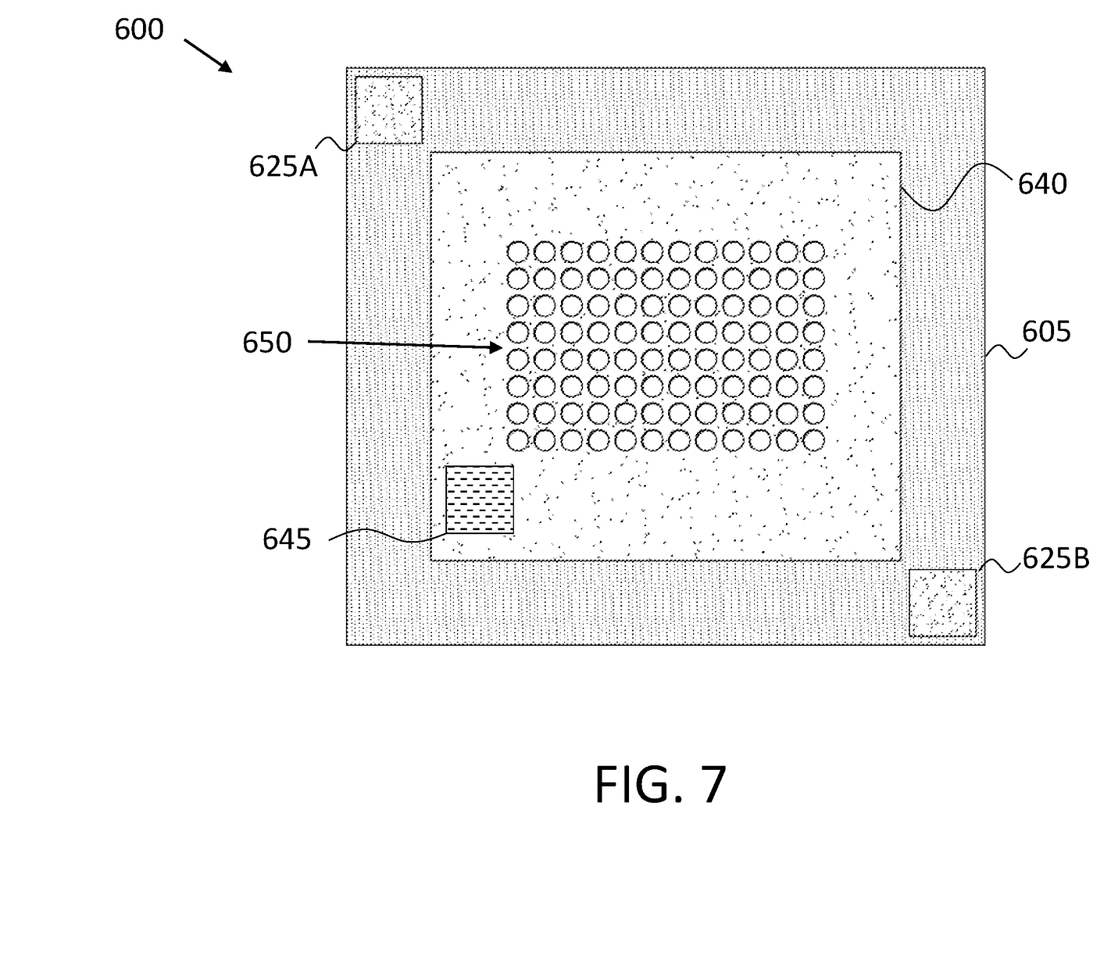
FIG. 7 depicts a plan view of an exemplary MEMS-based gas sensor implemented on a silicon wafer stack with bond pads on two levels.
Figure 8:
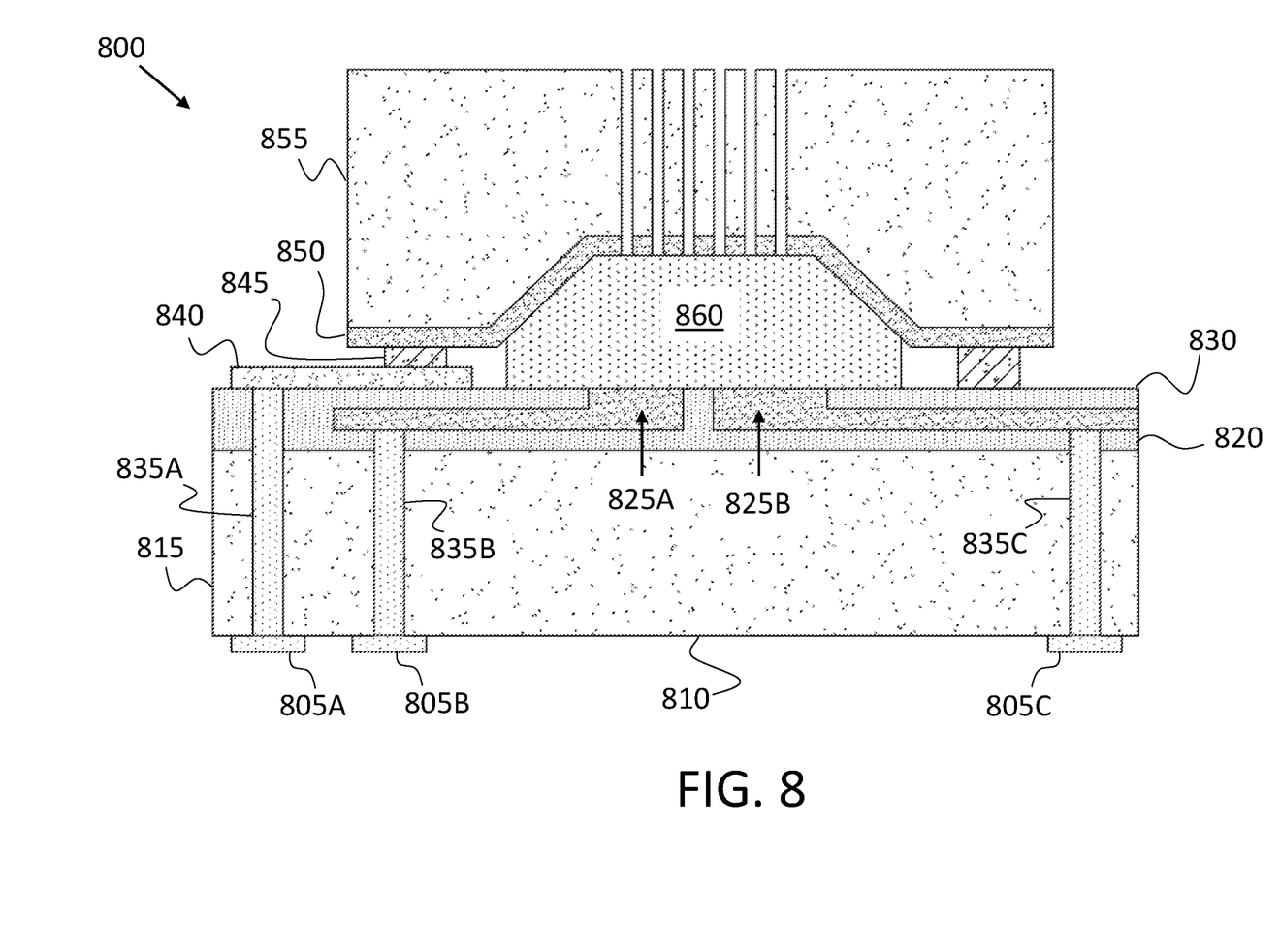
FIG. 8 depicts a cross-sectional elevation view of an exemplary MEMS-based gas sensor implemented on a silicon wafer stack with bond pads on the bottom side.
Figure 9:
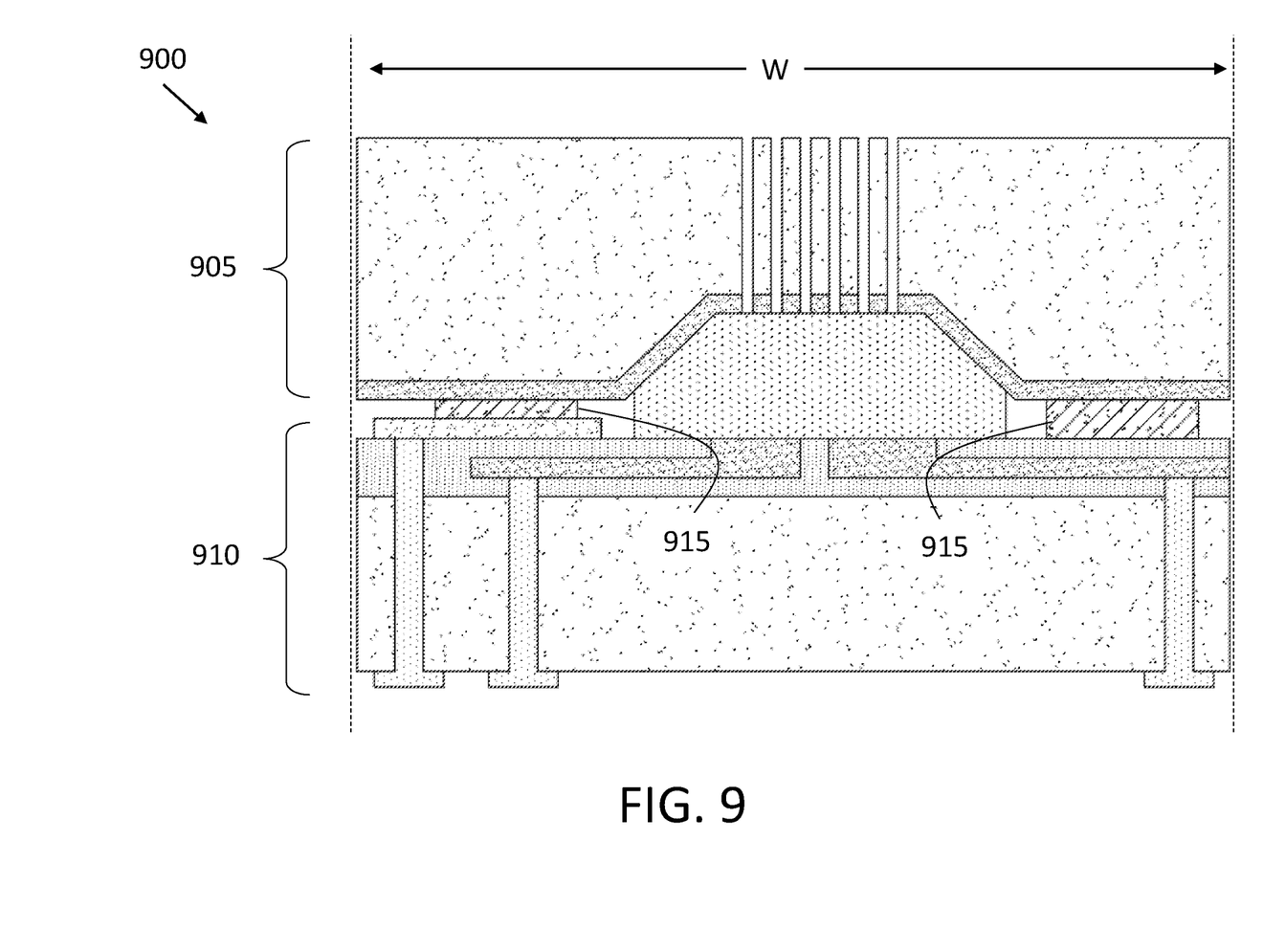
FIG. 9 depicts a cross-sectional elevation view of an exemplary MEMS-based gas sensor implemented on a silicon wafer stack with top and bottom wafers of the same size.
Figure 10:
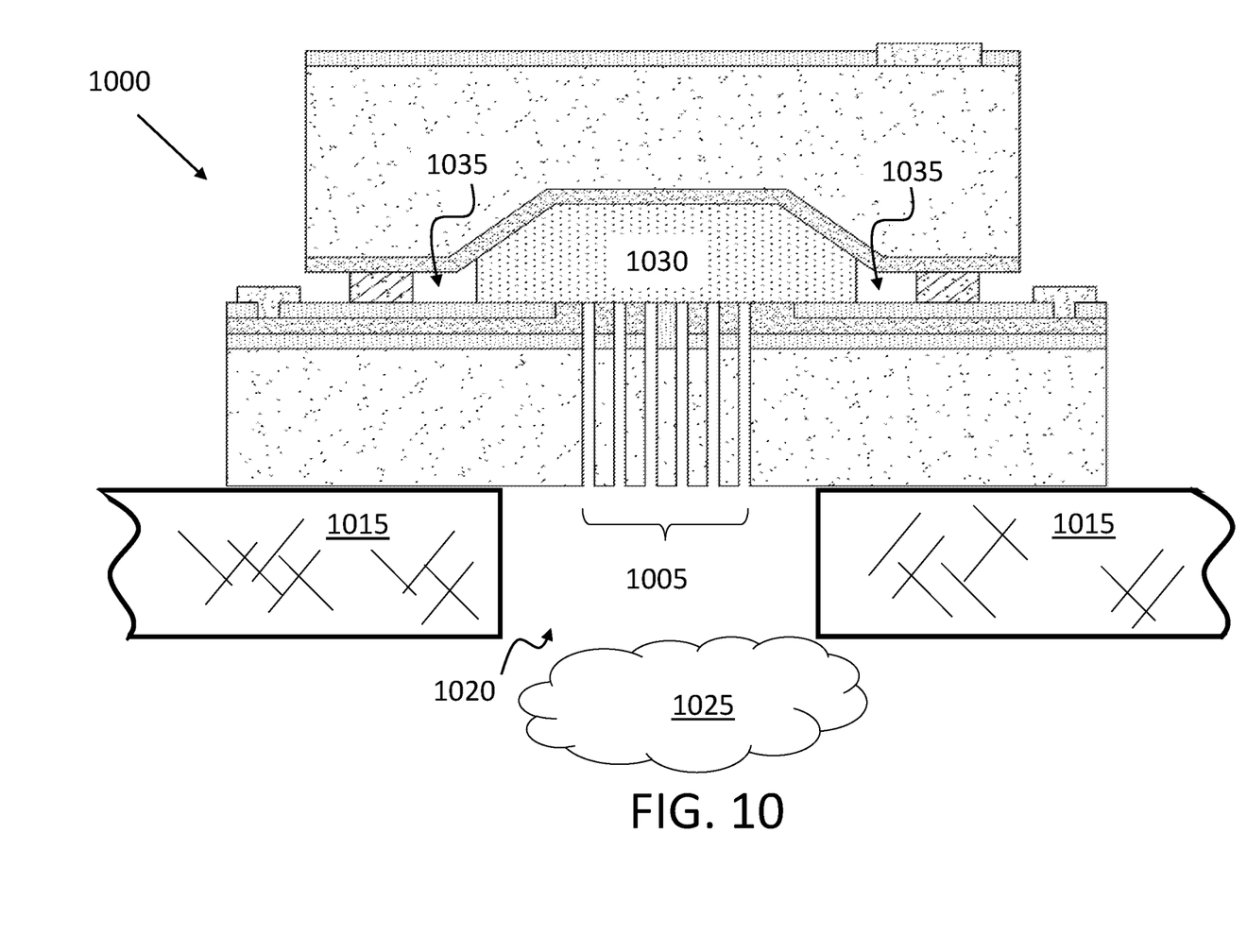
FIG. 10 depicts a cross-sectional elevation view of an exemplary MEMS-based gas sensor implemented on a silicon wafer stack with capillaries on the bottom side and with bond pads on two levels.

To aid understanding, this document is organized as follows. First, an exemplary MEMS-based gas sensor is shown implemented in a typical use case, the sensor being small enough to fit within a mobile device employed to detect a specific gas. Next with reference to FIGS. 2-10, various wafer stack configurations are briefly introduced. FIG. 2 shows a configuration with two electrodes. FIG. 3 depicts one electrode. FIG. 4 depicts an arrangement with the bond pads all on one level. FIG. 5 and FIG. 6 depict a convex upper wafer with bond pads on a single level and two levels, respectively. FIG. 7 shows exemplary bond pad locations from the top. FIG. 8 depicts an arrangement with the bond pads on the bottom. FIG. 9 shows an arrangement with a single die cut, leaving the top and bottom layers substantially the same size. FIG. 10 depicts gas entry from the bottom. It is noteworthy that FIGS. 2-6 and FIGS. 8-10 depict exemplary cross-sectional views, and as such, some horizontal layers may appear disconnected by various vertical structures (e.g., bond pads, electrodes, capillaries). It will be understood that the horizontal structures (e.g., wafer substrates, dielectric layers, insulation layers, platinum film layers) that appear broken but are noted with a single reference number may be continuous in other areas along the plane of the horizontal structure.

Figure 1:
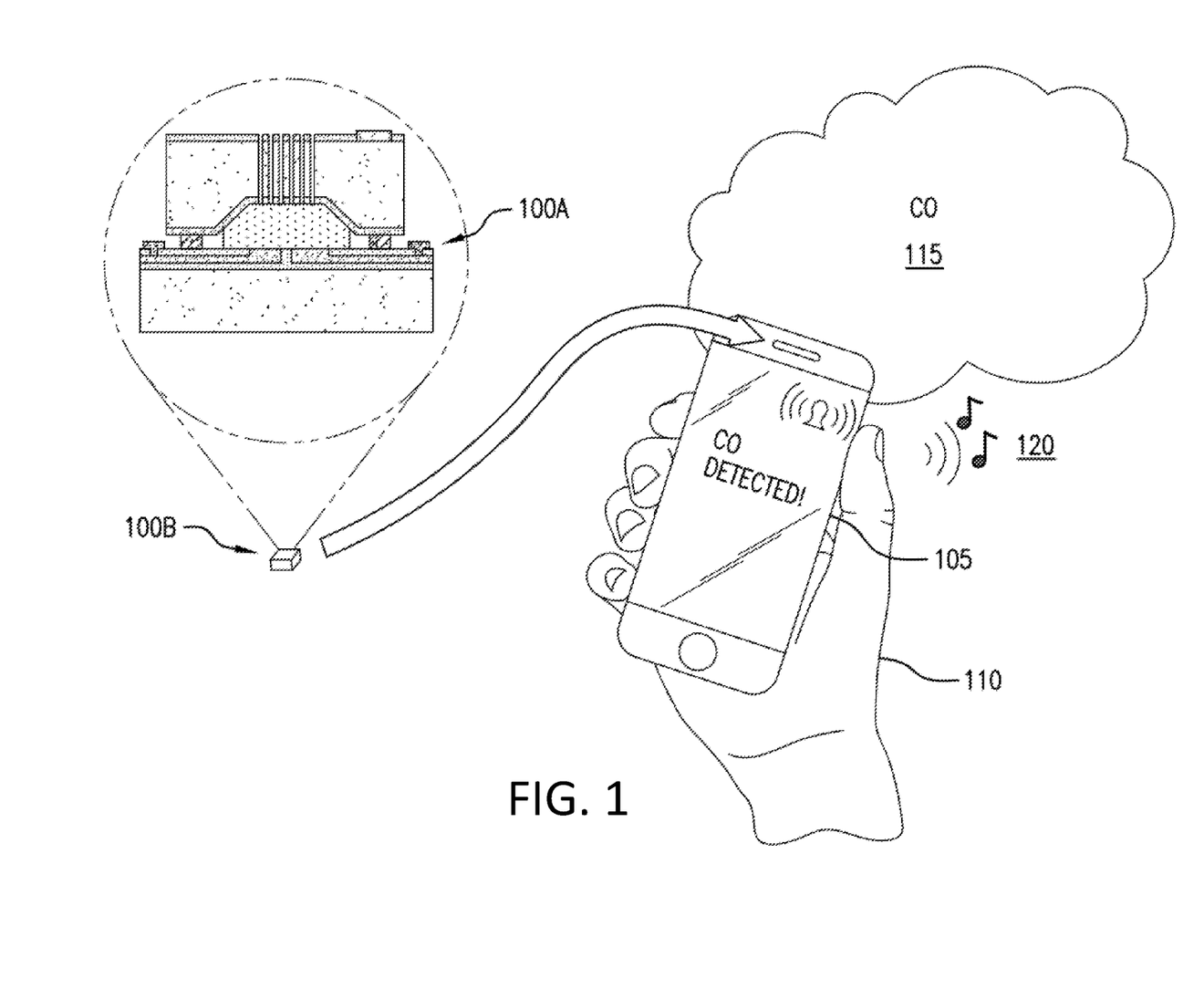
FIG. 1 depicts an exemplary MEMS-based gas sensor incorporated in a user's mobile device to detect carbon monoxide.

FIG. 1 depicts an exemplary MEMS-based gas sensor incorporated in a user's mobile device to detect carbon monoxide. In the depicted example, a MEMS-based gas sensor 100A exists in a miniature size 100B. The miniature size 100B may enable the MEMS-based gas sensor 100A to be incorporated within a mobile device 105 depicted held by a user 110. As the mobile device 105 is exposed to an ambient gas 115, the mobile device 105 alerts the user 110 with an alarm 120.

The MEMS-based gas sensor 100A may be applied for various gas detection uses. For example, air quality such as smog or other human irritants may be measured and displayed to the user 110. The user may decide to head indoors if the level of smog pollution is too high. In an illustrative example, a miner may carry his mobile device (e.g., cell phone, tablet, watch, laptop) into a mine. The mobile device may contain a MEMS-based gas sensor that is designed to detect one or more relevant gases (e.g., oxygen, carbon monoxide, hydrogen sulfide). The mobile device may alert the miner when one or more of those gases cross a predetermine threshold. Accordingly, the MEMS-based gas sensor 100A may protect the miner's health. Due to the small size of the MEMS-based gas sensor 100A, various mobile devices may incorporate one or more gas sensors for detection of one or more gases. Further, the MEMS-based gas sensor 100A may include two or more sensing electrodes within a single sensor.

In aerospace applications, users may monitor, for example, oxygen levels on an airplane. In some examples, oxygen levels may also be monitored by individuals who are prescribed oxygen therapy, such as individuals with chronic obstructive pulmonary disease (COPD). In such examples, the individuals may strap on an oxygen tank in situations where the oxygen levels decrease below a predetermined threshold.

In various home use embodiments, due to the small-size and low-cost of the MEMS-based gas sensor 100A, homeowners may purchase in-home gas sensors economically. The economical aspect of the MEMS-based gas sensor 100A may allow the homeowner to advantageously deploy the MEMS-based gas sensors 100A in more places and/or may bring multiple gas sensing (e.g., CO, hydrogen sulfide ($H_2S$), nitrogen oxides ($NO_x$), sulfur oxides ($SO_x$), volatile organic compounds (VOCs)) within an average homeowner's budget.

FIG. 2 depicts a cross-sectional elevation view of an exemplary two-electrode MEMS-based gas sensor implemented on a silicon wafer stack with bond pads on two levels. A MEMS-based gas sensor implementation 200 includes a bottom wafer 205. In some examples, the bottom wafer may be silicon which may advantageously provide a more rigid material, deforming minimally under loading conditions. Silicon may also be a cost-effective material. In some implementations, the bottom wafer 205 may be glass, which may advantageously provide hermetic sealing, provide greater flexibility, and may advantageously provide optic transparency.

An insulative layer 210 is grown on top of the bottom wafer 205. In some examples the insulative layer 210 may be a thermal oxide. In some implementations, the insulative layer 210 may be referred to as a buried oxide layer (BOX). On top of the insulative layer 210 is deposited a patterned film of platinum. The platinum film includes an electrode 215A and an electrode 215B. On top of the platinum film layer a dielectric layer 220 is deposited and patterned. A pair of bond pads 225A and 225B are implemented through the dielectric layer 220 and contact the electrodes 215A and 215B. In various implementations, the dielectric layer 220 patterning process may form vias for creation of electrical contacts between the electrodes 215A and 215B and the bond pads 225A and 225B. Next, an electrolyte 230 is placed on top of the electrodes 215A and 215B.

In some implementations, various metals may be used for the electrodes 215A and 215B. For example, gold, ruthenium or iridium or alloys may be used for the electrode(s) 215A and 215B depending on the target gas(es) to be detected.

In some embodiments, the electrolyte 230 may be a solid polymer electrolyte. Solid polymer electrolytes may resist evaporation which may advantageously produce a long-life product. Examples of electrolytes that may be suitable for some embodiments are described, for example, in FIG. 1, item 4, in U.S. patent application Ser. No. 10/343,162, titled "Gas Sensors," filed by Chapples, et. al., on Jul. 27, 2001, the entire disclosure of which is hereby incorporated by reference. In some implementations, the electrolyte 230 may be in a liquid or gel form. The liquid or gel forms of the electrolyte 230 may allow more rapid dispensing during manufacture of the gas sensor implementation 200.

The electrolyte 230 is in contact with a platinum film layer 235 deposited on the bottom of a top wafer 240. In some implementations, the top wafer 240 may be doped silicon in order to carry electrical current between one or both of the electrodes 215A and 215B and a top bond pad 245. The current may be generated at the interface between the electrode 215A and the electrolyte 230. Accordingly, the current may be generated between the electrode 215B and the electrolyte 230.

As shown in the depicted example, the top wafer 240 includes an insulative layer 250 grown on top. The insulative layer 250 may be a thick thermal oxide layer. An array of capillaries 255 are drilled through the top wafer 240. The capillaries 255 allow ambient gases to make their way to the electrolyte 230. Gases contacting the interface between one or both of the electrodes 215A and 215B and the electrolyte 230 may produce an electrical current flowing between the top bond pad 245 and one or both of the electrodes 215A and 215B. The bottom wafer stack-up (including the bottom wafer 205, the insulative layer 210, and the electrode 215A, the electrode 215B, the dielectric layer 220, the bond pad 225A, and the bond pad 225B) and the top wafer stack-up (including the platinum film layer 235, the top wafer 240, the top bond pad 245 and the insulative layer 250) are adhesively coupled via an adhesive 260. The bottom wafer stack-up and the top wafer stack-up capture the electrolyte 230 which is fully encircled by the adhesive 260. The adhesive 260 may act as a seal, sealing the electrolyte 230 from the ambient environment. Accordingly, any gases contacting the electrolyte 230 may only have reached the electrolyte 230 in a controlled manner through the capillaries 255.

In various examples, the adhesive 260 may be various types of glass bonding, for example, a glass frit. Manufacturers may bond the wafers 205 and 240 together using the glass frit method, implemented with low heating which may advantageously guard against damage to the electrolyte 230 during the bonding process. The adhesive 260 may be a metal adhesive layer.

In some implementations, the recess in the top wafer 240 directly above the electrolyte 230 may be created using a potassium hydroxide (KOH) etch process. The KOH etch may produce a characteristic V-etch with sidewalls and may form a precisely controlled angle with respect to the surface of the top wafer 240. The etched V-shape area may create space for the electrolyte 230. In some examples, the platinum film layers may define a counter electrode, a reference electrode and/or a test electrode.

FIG. 3 depicts a cross-sectional elevation view of an exemplary single-electrode MEMS-based gas sensor implemented on a silicon wafer stack. A MEMS-based gas sensor implementation 300 includes a bottom wafer 305. An insulative material 310 is grown on top of the bottom wafer 305. On top of the insulative material 310 is deposited and patterned a layer of platinum film. The platinum film layer includes a single electrode 315. On top of the single electrode 315 a dielectric layer 320 is deposited and patterned. A bond pad 325 is implemented through the dielectric layer 320 and contacting the electrode 315.

A top wafer 330, which will be positioned above the bottom wafer 305 in a later step, is prepared by growing a thick thermal oxide (not shown) on one surface. The thermal oxide is patterned in the area of the top wafer 330 that will correspond to the electrode area of the bottom wafer 305, removing the thermal oxide in this corresponding area.

Next, the silicon of the top wafer 330 is etched in the open area of the thermal oxide to produce a cavity. This process may be implemented with wet chemistry or plasma chemistry, for example, a wet etchant of potassium hydroxide (KOH). In some examples, the plasma chemistry may be the Bosch process or anisotropic etch. The cavity may be etched to a depth of about 1 µm, 2 µm, 3 µm, 4 µm, 5 µm, 6 µm, 7 µm, 8 µm, 9 µm, 10 µm, 20 µm, 30 µm, 40 µm, 50 µm, 60 µm, 70 µm, 80 µm, 90 µm or about 100 µm. The cavity may provide extra space for an electrolyte 335 when the top wafer 330 and the bottom wafer 305 are joined.

Next, another thermal silicon oxide 330A is grown on the etched side of the top wafer 330. In some examples, a plasma enhanced chemical vapor deposition (PECVD) of silicon oxide may be deposited on the etched side of the top wafer 330. On the side of the top wafer 330 opposite of the etched cavity, capillary holes 340 are patterned opposite the cavity. In some examples, deep reactive ion etching (DRIE) may be employed to etch the capillary holes 340 through the top wafer 330 to the silicon oxide 330A on the opposite side. The silicon oxide 330A may serve as an etch stop for the DRIE. Next, a second plasma etch may be employed to etch through the silicon oxide 330A at the bottom of the capillary holes 340. Next, a film of platinum 345 is deposited on the cavity side of the wafer. The film of platinum may be an electrode. In various examples, the film of platinum may be referred to as a top electrode.

As discussed, deep reactive ion etching (DRIE) may be employed to etch the capillary holes 340 through the top wafer 330 to the silicon oxide 330A on the opposite side. In some procedural examples, a film of platinum 345 may be deposited next on the cavity side of the wafer. A second plasma etch may be employed next to etch through the silicon oxide 330A at the bottom of the capillary holes 340.

In some embodiments, a cavity may be etched into the bottom wafer 305 either by patterning and etching, or by defining the cavity with frit glass. In such examples, the top wafer 330 may not include a cavity.

Prior to placing the top wafer 330 onto the bottom wafer 305, a bonding agent 350 is deposited around the electrode 315 on the bottom wafer 305. Next, the top wafer 330 and the bottom wafer 305 are placed and aligned and bonded. Once the wafers 305 and 330 are bonded, they may be sliced into individual sensors by various methods (e.g., sawing, laser cutting). In some embodiments, a gas diffusion electrode (e.g., 215A, 215B, 235, 315 and/or 345) may be placed or printed on each component wafer 305 and 330. An electrolyte (e.g., 230, 335) may be deposited or printed on the gas diffusion electrode (e.g., 215A, 215B, 235, 315 and/or 345). When the wafers 305 and 330 are brought into contact and bonded, the gas diffusion electrode/electrolyte stack may be completed.

In some embodiments, the wafers 305 and 330 may be glass. In these embodiments, the bottom wafer may follow the same sequence as described above with the thermal oxidation step removed. For a glass top wafer 330, the cavity may be formed by wet etching or media blasting such as micro-abrasive jet machining. The capillary holes 340 may be formed, for example, by laser drilling or ultrasonic machining and/or drilling.

FIG. 4 depicts a cross-sectional elevation view of an exemplary MEMS-based gas sensor implemented on a silicon wafer stack with bond pads on a single level. A MEMS-based gas sensor implementation 400 includes a bottom wafer 405. An insulative material 410 is grown on top of the bottom wafer 405. On top of the insulative material 410 is deposited and patterned a layer of platinum film. The platinum film layer includes an electrode 415A and an electrode 415B. On top of the platinum film layer, a dielectric layer 420 is deposited and patterned. A pair of bond pads 425A and 425B are implemented on top of and through the dielectric layer 420. The pair of bond pads 425A and 425B contact the electrodes 415A and 415B. In various implementations, the dielectric layer 420 patterning process may form vias for creation of electrical contacts between the electrodes 415A and 415B and the bond pads 425A and 425B. Next, an electrolyte 430 is positioned on top of the electrodes 415A and 415B. The electrolyte 430 is in contact with a platinum film layer 435 deposited on the bottom of a top wafer 440.

In the depicted example, incident gases 450 may travel through one or more capillaries 445 from an ambient atmosphere to the electrolyte 430. These gases 450 may dissolve at the interface between the electrodes 415A and 415B and the electrolyte 430. This gas dissolving activity may cause an electrochemical reaction which may generate electrons which may flow through an external measurement circuit. The electron flow may be an electrical current. Accordingly, the electrical current may flow from one or both of the bond pads 425A and/or 425B, through one or both of the electrodes 415A and/or 415B, through the electrolyte 430, through the platinum film layer 435, though an adhesive 455, to a bond pad 460. A measurement circuit (not shown) completes the path from the bond pad 460 back to one or both of the bond pads 425A and/or 425B. In some examples, the adhesive 455 may be a conductive adhesive. The MEMS-based gas sensor implementation 400 in this depicted example provides bond pads 425A, 425B and 460 on the same level which may advantageously allow a straightforward bond wire connection methodology.

FIG. 5 depicts a cross-sectional elevation view of an exemplary MEMS-based gas sensor implemented on a silicon wafer stack with a convex top wafer and with bond pads on a single level. A MEMS-based gas sensor implementation 500 includes an electrolyte 505. The electrolyte 505 is captured between a lower wafer 510 and an upper wafer 515. In the depicted example, the upper wafer 515 is convex (bowing toward the electrolyte 505). In this implementation, the electrolyte 505 may be employed advantageously with less stringent dimensional requirements, as it is captured on two sides only (top and bottom). As in FIG. 4, the electrolyte 505 is sealed by an adhesive 520 sealably engaged between the lower wafer 510 and the upper wafer 515.

FIG. 6 depicts a cross-sectional elevation view of an exemplary MEMS-based gas sensor implemented on a silicon wafer stack with a convex top wafer and with bond pads on two levels. A MEMS-based gas sensor implementation 600 includes a bottom wafer 605. An insulative material 610 is grown on top of the bottom wafer 605. On top of the insulative material 610 is deposited and patterned a layer of platinum film. The platinum film layer includes an electrode 615A and an electrode 615B. On top of the platinum film layer, a dielectric layer 620 is deposited and patterned. A pair of bond pads 625A and 625B are implemented through the dielectric layer 620 and contacting the electrodes 615A and 615B. In various implementations, the dielectric layer 620 patterning process may form vias for creation of electrical contacts between the electrodes 615A and 615B and the bond pads 625A and 625B. Next, an electrolyte 630 is deposited on top of and in contact with the electrodes 615A and 615B. The electrolyte 630 is in contact with a platinum film layer 635 deposited on the bottom of a top wafer 640. The platinum film layer 635 may be a top electrode. In some implementations, the top wafer 640 may be doped silicon to facilitate conduction of current between the platinum film layer 635 (e.g., the top electrode) and a top bond pad 645.

Through the top wafer 640 are drilled an array of capillaries 650. The capillaries 650 allow ambient gases 655 to make their way to the electrolyte 630. These gases 655 may dissolve at the interface between the electrodes 615A and 615B and the electrolyte 630. This gas dissolving activity may cause an electrochemical reaction which may generate electrons. The electrons may flow through an external measurement circuit. The electron flow may be an electrical current. Accordingly, the electrical current may flow between the top bond pad 645 and one or both electrodes 615A and 615B. The bottom wafer 605 and the top wafer 640 are adhesively coupled via an adhesive 660. The adhesive 660 may act as a seal, sealing the electrolyte 630 from the ambient environment. Accordingly, gases contacting the electrolyte 630 may only have reached the electrolyte 630 in a controlled manner through the capillaries 650.

FIG. 7 depicts a plan view of an exemplary MEMS-based gas sensor implemented on a silicon wafer stack with bond pads on two levels. The exemplary MEMS-based gas sensor implementation 600 in FIG. 7 may be a top view of the MEMS-based gas sensor implementation 600 depicted in FIG. 6. The MEMS-based gas sensor implementation 600 includes the bottom wafer 605, and the top wafer 640. The bottom wafer 605 includes the bond pads 625A and 625B. Included on the top wafer 640 are the capillaries 650 and the top bond pad 645. Further, the MEMS-based gas sensor implementation 600 may be rectangular.

FIG. 8 depicts a cross-sectional elevation view of an exemplary MEMS-based gas sensor implemented on a silicon wafer stack with bond pads on the bottom side. An exemplary MEMS-based gas sensor implementation 800 includes bottom bond pads 805A, 805B and 805C. The bottom bond pads 805A, 805B and 805C on a backside wafer surface 810 may facilitate attachment of the MEMS-based gas sensor implementation 800 as a ball-grid array (BGA) component. The bottom bond pads 805A, 805B and 805C are located on the backside wafer surface 810 of a starting wafer 815. A buried oxide layer (BOX) 820 is grown on top of the starting wafer 815. A platinum film layer is deposited and patterned on top of the BOX 820 forming platinum film layer electrodes 825A and 825B. An insulative layer 830 is included on top of the platinum film layer electrodes 825A and 825B. The bottom bond pads 805A, 805B and 805C are operatively coupled to vias 835A, 835B and 835C, respectively.

The via 835A operatively couples the bond pad 805A to a metallization layer 840. The metallization layer 840 is adhesively coupled to an adhesive 845. The adhesive 845 may be electrically conductive and may be operably coupled to the metallization layer 840. The adhesive 845 is operably coupled to a platinum film layer 850. The platinum film layer 850 is disposed on a top wafer 855. The platinum film layer 850 is in electrical contact with an electrolyte 860. The interface between the platinum film layer 850 and the electrolyte 860 may be configured to generate an electrical current signal in response to exposure to gas molecules.

The via 835B operatively couples the bond pad 805B to the platinum film layer electrode 825A. The platinum film layer electrode 825A is in electrical contact with the electrolyte 860. Electrical current from the interface between the electrodes (e.g., the platinum film layer electrode 825A, the platinum film layer electrode 825B) and the electrolyte 860, in response to gas exposure, may travel through the platinum film layer electrode 825A through the via 835B to the bond pad 805B. In an illustrative example, the bond pad 805B may be operatively coupled to an external current monitor via a connection of the bond pad 805B to a printed circuit board (PCB).

The via 835C operatively couples the bond pad 805C to the platinum film layer electrode 825B. The platinum film layer electrode 825B is in electrical contact with the electrolyte 860. In some examples the bond pad 805C may be operatively coupled to an external current measuring subsystem via a connection to a substrate. The substrate may be, for example, silicon, ceramic or glass.

In the exemplary embodiment depicted in FIG. 8, the MEMS-based gas sensor may be made thinner. By utilizing conductive vias as exemplified in this embodiment, the bottom wafer may be thinned for various miniaturized applications (e.g., mobile phones, watches, laptops, custom mobile gas sensors).

FIG. 9 depicts a cross-sectional elevation view of an exemplary MEMS-based gas sensor implemented on a silicon wafer stack with top and bottom wafers of the same size. In the depicted example of a MEMS-based gas sensor die 900, a top layer sensor stack 905 and a bottom layer sensor stack 910 are both width W. During manufacture of the MEMS-based gas sensor die 900, a top wafer with one or more of the top layer sensor stacks 905 and a starting wafer with one or more instances of the bottom layer sensor stacks 910 are adhesively coupled with a bead of epoxy 915. The individual dies 900 may be separated from the adhesively coupled starting wafer and top wafer assembly by a cut from a single side. Accordingly, cuts through the fully assembled wafer stack from a single side may advantageously eliminate the need to cut partway through the top of the wafer stack and partway through the bottom of the wafer stack, thereby reducing cost by eliminating a fabrication step.

FIG. 10 depicts a cross-sectional elevation view of an exemplary MEMS-based gas sensor implemented on a silicon wafer stack with capillaries on the bottom side and with bond pads on two levels. In the depicted example of a MEMS-based gas sensor 1000, a field of one or more gas communication wells 1005 are disposed within a bottom stack-up 1010. The MEMS-based gas sensor 1000 is placed on a substrate 1015 (e.g., ceramic, PCB, silicon wafer). The substrate 1015 includes an aperture 1020 located directly below the one or more gas communication wells 1005. In some implementations, an ambient gas 1025 present beneath the substrate 1015, may be in fluid communication with an electrolyte 1030 via the gas communication wells 1005. The electrolyte 1030 is within a sealed chamber 1035 included on the MEMS-based gas sensor 1000. The bottom-located gas communication wells 1005 may advantageously provide a convenient mounting option for the MEMS-based gas sensor 1000, for example, in applications that dictate active circuitry segregation from an ambient environment.

Although various embodiments have been described with reference to the figures, other embodiments are possible. For example, bonding of the wafer stacks may be bonded by epoxy. Use of epoxy as a bonding agent may advantageously provide a cost-effective bond. In some examples, epoxy may provide flexibility of the bond and mitigate cracking of the wafer stacks.

In various implementations, the top wafer may include a top insulative layer (e.g., FIG. 2, item 250). In some implementations, the top wafer may exclude a top insulative layer (e.g., FIG. 5). In some embodiments the electrode layer (e.g. FIG. 8, item 825B) may be offset horizontally away from the edge of the die, as depicted in FIG. 8, item 825A.

In some examples, the gas detection mechanism may be a conventional electrochemical mechanism. In an illustrative carbon monoxide sensor example, carbon monoxide may be electrochemically oxidized at a sensing electrode while oxygen may be reduced at a counter electrode. An optional reference electrode may be included which may include platinum, for example. Platinum may advantageously provide a stable reference potential against which the sensing electrode may be controlled.

In some embodiments, the wafer stacks may be bonded by direct bonding. Direct bonding may advantageously produce a low-profile MEMS assembly. In various embodiments, the wafer stacks may be bonded by implementation of surface activated bonding. Surface activated bonding may produce a low-profile MEMS assembly with less applied heat. Plasma-activation processes may also provide bonding at low temperature, and may be a faster activation process. Anodic bonding may be employed to produce hermetic seals. Examples of MEMS structures that may be suitable for some embodiments are described, for example, in FIG. 1, in International Application Serial No. PCT/EP2016/050315, titled "MEMS Electrochemical Gas Sensor," filed by Pratt, et. al., on Jan. 8, 2016, the entire disclosure of which is hereby incorporated by reference.

In various examples, bonding between wafers may be accomplished with eutectic bonding, which may produce an electrically conductive bond at relatively low temperatures. Thermocompression or diffusion bonding may be implemented on the wafer stacks which may advantageously be accomplished in one process step. Reactive bonding may be used to bond the wafer stacks and may be advantageously based on nano-scale multilayers and may be implemented with relatively low heat. In some examples, where the wafer stacks may be metallic and/or ceramic based, transient liquid phase diffusion bonding may be employed.

In an illustrative example, the MEMS-based gas sensor may be implemented with long narrow capillaries to operate in a diffusion limited mode, where the signal from the sensor is proportional to the rate which gas can diffuse down the capillaries. In various embodiments capillaries may be added to allow gases to spread out to make uniform contact and efficient use of an electrolyte. The surrounding adhesive seal may mitigate gases from contacting the sides of the electrolyte, thereby forcing the gas to enter through the capillaries. In this way, side reactions on the electrolyte may be mitigated. By implementation of the adhesive seal, the electrolyte may be prevented from being governed by actual electrode kinetics, which may be the rate of reaction between the electrode and the electrolyte. Accordingly, any gases contacting the electrolyte may only have reached the electrolyte in a controlled manner through the capillaries, which may advantageously increase accuracy and reduce variations over temperature.

The capillaries may be fabricated using various methods. For example, deep reactive ion etching may be employed to create the capillaries. In some embodiments, a standard reactive ion etch process may be employed. In various examples, a Bosch process may be employed.

In various implementations, the electrolyte may be enclosed. The enclosure may be defined laterally by a surrounding adhesive bead, and vertically by the top and bottom wafer stacks. Though the cross-sectional figures show the adhesive separately on either side of the electrolyte, the adhesive may be a continuous structure fully encircling and enclosing the electrolyte in the plane of the wafers. A solid electrolyte polymer may be deposited directly on each die on a base electrode wafer and may be capped with a top wafer with capillaries for gas permeation, and may include one or more electrodes. The MEMS-based design may advantageously avoid handling of gas diffusion electrodes, and may avoid cutting or punching out solid electrolyte material during fabrication. Picking and placing gas diffusion electrodes may not be included in the process steps. In various embodiments, the dielectric layer(s) may include, for example, silicon nitride, silicon oxide and/or silicon oxynitride.

Various bond pad implementations may include gold over titanium tungsten (TiW/Au) or aluminum over titanium-tungsten (TiW/Al). In some examples, the aluminum may be pure aluminum, aluminum with silicon, or aluminum with silicon and copper.

In embodiments where one or more of the dimensions of the top wafer stack-up is smaller than the bottom wafer stack-up, various die slicing techniques may be employed. For example, the top wafer may be sliced from the top in a first slicing operation, the slicing operation stopping at the top of the bottom wafer. Next, a second slicing operation may be performed on the bottom wafer. In some examples, the slicing may initiate from the top side for both operations. In some examples, the slicing operations may initiate from opposite sides.

The MEMS-based gas sensor may be a low-cost, small footprint electrochemical sensor which may detect various gases (e.g., carbon monoxide, hydrogen sulfide, volatile organic compounds (VOCs), nitric oxide, nitrogen dioxide, sulfur dioxide, ozone, hydrogen chloride, hydrogen, phosphane, ammonia). The MEMS-based gas sensor may be small enough to be contained within various mobile devices (e.g., cell phones, tablets, laptop computers, watches, mobile music players, custom-application mobile gas detectors).

The small size of the MEMS-based sensor may be compatible with the Internet of Things (IoT). Accordingly, various implementations may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices. The small size of the MEMS-based gas sensor may also use minimal amounts of platinum, which may advantageously reduce the cost of implementation. The MEMS-based sensor may be an edge device. As such, the MEMS-based sensor may include interface hardware, a controller and embedded software that may enable the senor to be securely connected to the Internet cloud via a wired or a wireless connection.

In an exemplary aspect, an ambient gas sensing apparatus may include a bottom wafer (305), a top wafer (330) disposed above the bottom wafer (305), at least one bottom electrode (315) disposed proximate to a top surface of the bottom wafer (305), an insulative layer (310) disposed between the top surface of the bottom wafer (305) and at least one bottom electrode (315). A top electrode (345) disposed proximate to a bottom surface of the top wafer (330), an electrolyte (335) disposed between the bottom wafer (305) and the top wafer (330), and the electrolyte (335) may be in electrical communication with the at least one bottom electrode (315) and the top electrode (345). The bonding agent (350) may fixedly couple the bottom wafer (305) to the top wafer (330). The bonding agent (350) may circumscribe the electrolyte (335) to limit fluid communication between the electrolyte (335) and an external ambient environment.

The system may further include a dielectric layer (320) disposed on a top surface of the at least one bottom electrode (315). The system may further include at least one bond pad (325) disposed on a top surface of the dielectric layer (320) and extending through the dielectric layer (320) to be in electrical communication with the at least one bottom electrode (315).

The system may further include gas capillaries (340) disposed in the top wafer (330) for providing limited fluid communication between the top electrode (345) and the external ambient environment. In some embodiments, gas capillaries (1005) may be disposed in the bottom wafer (305) for providing limited fluid communication between the at least one bottom electrode (315) and the external ambient environment.

The system may further include a top bond pad (245) configured to carry electrical current between at least one top electrode (345) and at least one top bond pad (245) via the top wafer (330). In some examples, the bottom electrode (315) may include a first bottom electrode (215A) and a second bottom electrode (215B). The system may further include a first bond pad (225A) in electrical communication with the first bottom electrode (215A), and a second bond pad (225B) in electrical communication with the second bottom electrode (215B). The top wafer (330) may include a cavity in the bottom surface of the top wafer (330) configured to receive the electrolyte (335). The top wafer (330) may include a convex surface on the bottom surface of the top wafer (330) configured to capture the electrolyte (335) between the top wafer (330) and the bottom wafer (305).

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

PREFERRED EMBODIMENTS OF THE PRESENT INVENTION ARE AS NUMBERED BELOW

1. An ambient gas sensing apparatus comprising:
    a bottom wafer (305);
    a top wafer (330) disposed above the bottom wafer (305);
    at least one bottom electrode (315) disposed proximate to a top surface of the bottom wafer (305);
    an insulative layer (310) disposed between the top surface of the bottom wafer (305) and the at least one bottom electrode (315);
    a top electrode (345) disposed proximate to a bottom surface of the top wafer (330);
    an electrolyte (335) disposed between the bottom wafer (305) and the top wafer (330), the electrolyte (335) being in electrical communication with the at least one bottom electrode (315) and the top electrode (345); and,
    a bonding agent (350) that fixedly couples the bottom wafer (305) to the top wafer (330), the bonding agent (350) circumscribing the electrolyte (335) to limit fluid communication between the electrolyte (335) and an external ambient environment.

2. The ambient gas sensing apparatus of 1, further comprising a dielectric layer (320) disposed on a top surface of the at least one bottom electrode (315).

3. The ambient gas sensing apparatus of 2, further comprising at least one bond pad (325) disposed on a top surface of the dielectric layer (320) and extending through the dielectric layer (320) to be in electrical communication with the at least one bottom electrode (315).

4. The ambient gas sensing apparatus of 1, further comprising gas capillaries (340) disposed in the top wafer (330) for providing limited fluid communication between the top electrode (345) and the external ambient environment.

5. The ambient gas sensing apparatus of 1, further comprising gas capillaries (1005) disposed in the bottom wafer (305) for providing limited fluid communication between the at least one bottom electrode (315) and the external ambient environment.

6. The ambient gas sensing apparatus of 1, further comprising a top bond pad (245) configured to carry electrical current between the at least one top electrode (345) and the top bond pad (245) via the top wafer (330).

7. The ambient gas sensing apparatus of 1, wherein the at least one bottom electrode (315) comprises a first bottom electrode (215A) and a second bottom electrode (215B).

8. The ambient gas sensing apparatus of 7, further comprising a first bond pad (225A) in electrical communication with the first bottom electrode (215A), and a second bond pad (225B) in electrical communication with the second bottom electrode (215B).

9. The ambient gas sensing apparatus of 1, wherein the top wafer (330) comprises a cavity in the bottom surface of the top wafer (330) configured to receive the electrolyte (335).

10. The ambient gas sensing apparatus of 1, wherein the top wafer (330) comprises a convex surface on the bottom surface of the top wafer (330) configured to capture the electrolyte (335) between the top wafer (330) and the bottom wafer (305).

11. An ambient gas sensing apparatus comprising:
    a bottom wafer (305);
    a top wafer (330) disposed above the bottom wafer (305);
    at least one bottom electrode (315) disposed proximate to a top surface of the bottom wafer (305);
    a top electrode (345) disposed proximate to a bottom surface of the top wafer (330);
    an electrolyte (335) disposed between the bottom wafer (305) and the top wafer (330), the electrolyte (335) being in electrical communication with the at least one bottom electrode (315) and the top electrode (345); and, a bonding agent (350) that fixedly couples the bottom wafer (305) to the top wafer (330), the bonding agent (350) circumscribing the electrolyte (335) to limit fluid communication between the electrolyte (335) and an external ambient environment.

12. The ambient gas sensing apparatus of 11, further comprising gas capillaries (340) disposed in the top wafer (330) for providing limited fluid communication between the top electrode (345) and the external ambient environment.

13. The ambient gas sensing apparatus of 11, further comprising gas capillaries (1005) disposed in the bottom wafer (305) for providing limited fluid communication between the at least one bottom electrode (315) and the external ambient environment.

14. The ambient gas sensing apparatus of 11, further comprising a top bond pad (245) configured to carry electrical current between the at least one top electrode (345) and the top bond pad (245) via the top wafer (330).

15. The ambient gas sensing apparatus of 1, wherein the top wafer (330) comprises a cavity in the bottom surface of the top wafer (330) configured to receive the electrolyte (335).

16. The ambient gas sensing apparatus of 1, wherein the top wafer (330) comprises a convex surface on the bottom surface of the top wafer (330) configured to capture the electrolyte (335) between the top wafer (330) and the bottom wafer (305).

17. An ambient gas sensing apparatus comprising:
 a bottom wafer (305);
 a top wafer (330) disposed above the bottom wafer (305);
 at least one bottom electrode (315) disposed proximate to a top surface of the bottom wafer (305);
 a dielectric layer (320) disposed on a top surface of the at least one bottom electrode (315);
 a top electrode (345) disposed proximate to a bottom surface of the top wafer (330);
 an electrolyte (335) disposed between the bottom wafer (305) and the top wafer (330), the electrolyte (335) being in electrical communication with the at least one bottom electrode (315) and the top electrode (345); and,
 a bonding agent (350) that fixedly couples the bottom wafer (305) to the top wafer (330), the bonding agent (350) circumscribing the electrolyte (335) to limit fluid communication between the electrolyte (335) and an external ambient environment.

18. The ambient gas sensing apparatus of 11, further comprising at least one bond pad (325) disposed on a top surface of the dielectric layer (320) and extending through the dielectric layer (320) to be in electrical communication with the at least one bottom electrode (315).

19. The ambient gas sensing apparatus of 1, wherein the top wafer (330) comprises a cavity in the bottom surface of the top wafer (330) configured to receive the electrolyte (335).

20. The ambient gas sensing apparatus of 1, wherein the top wafer (330) comprises a convex surface on the bottom surface of the top wafer (330) configured to capture the electrolyte (335) between the top wafer (330) and the bottom wafer (305).

The invention claimed is:

1. An ambient gas sensing apparatus comprising:
 a bottom wafer;
 a top wafer disposed above the bottom wafer;
 at least one bottom electrode disposed on a top surface of the bottom wafer;
 an insulative layer disposed between the top surface of the bottom wafer and the at least one bottom electrode;
 a top electrode disposed on a bottom surface of the top wafer;
 an electrolyte disposed between the bottom water and the top wafer, the electrolyte being in electrical communication with the at least one bottom electrode and the top electrode; and,
 a bonding agent that fixedly couples the bottom wafer to the top wafer, the bonding agent circumscribing the electrolyte to limit fluid communication between the electrolyte and an external ambient environment.

2. The ambient gas sensing apparatus of claim 1, further comprising a dielectric layer disposed on a top surface of the at least one bottom electrode.

3. The ambient gas sensing apparatus of claim 2, further comprising at least one bond pad disposed on a top surface of the dielectric layer and extending through the dielectric layer to be in electrical communication with the at least one bottom electrode.

4. The ambient gas sensing apparatus of claim 1, further comprising gas capillaries disposed in the top wafer for providing limited fluid communication between the top electrode and the external ambient environment.

5. The ambient gas sensing apparatus of claim 1, further comprising gas capillaries disposed in the bottom wafer for providing limited fluid communication between the at least one bottom electrode and the external ambient environment.

6. The ambient gas sensing apparatus of claim 1, further comprising a top bond pad configured to carry electrical current between the top electrode and the top bond pad via the top wafer.

7. The ambient gas sensing apparatus of claim 1, wherein the at least one bottom electrode comprises a first bottom electrode and a second bottom electrode.

8. The ambient gas sensing apparatus of claim 7, further comprising a first bond pad in electrical communication with the first bottom electrode, and a second bond pad in electrical communication with the second bottom electrode.

9. The ambient gas sensing apparatus of claim 1, wherein the top wafer comprises a cavity in the bottom surface of the top wafer configured to receive the electrolyte.

10. The ambient gas sensing apparatus of claim 1, wherein the top wafer comprises a convex surface on the bottom surface of the top wafer configured to capture the electrolyte between the top wafer and the bottom wafer.

11. An ambient gas sensing apparatus comprising:
 a bottom wafer;
 a top wafer disposed above the bottom wafer;
 at least one bottom electrode disposed on a top surface of the bottom wafer;
 a top electrode disposed on a bottom surface of the top wafer;
 an electrolyte disposed between the bottom wafer and the top wafer, the electrolyte being in electrical communication with the at least one bottom electrode and the top electrode; and,
 a bonding agent that fixedly couples the bottom wafer to the top wafer, the bonding agent circumscribing the electrolyte to limit fluid communication between the electrolyte and an external ambient environment.

12. The ambient gas sensing apparatus of claim 11, further comprising gas capillaries disposed in the top wafer for providing limited fluid communication between the top electrode and the external ambient environment.

13. The ambient gas sensing apparatus of claim 11, further comprising gas capillaries disposed in the bottom wafer for providing limited fluid communication between the at least one bottom electrode and the external ambient environment.

14. The ambient gas sensing apparatus of claim 11, further comprising a top bond pad configured to carry electrical current between the top electrode and the top bond pad via the top wafer.

15. The ambient gas sensing apparatus of claim 11, wherein the top wafer comprises a cavity in the bottom surface of the top wafer configured to receive the electrolyte.

16. The ambient gas sensing apparatus of claim 11, wherein the top wafer comprises a convex surface on the bottom surface of the top wafer configured to capture the electrolyte between the top wafer and the bottom wafer.

* * * * *